(12) United States Patent
Huang et al.

(10) Patent No.: US 12,426,371 B2
(45) Date of Patent: Sep. 23, 2025

(54) SENSING DEVICE

(71) Applicant: AUO Corporation, Hsinchu (TW)

(72) Inventors: Te-Chun Huang, Hsinchu (TW);
Pei-Ming Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 526 days.

(21) Appl. No.: 17/882,622

(22) Filed: Aug. 8, 2022

(65) Prior Publication Data

US 2023/0230978 A1 Jul. 20, 2023

Related U.S. Application Data

(60) Provisional application No. 63/300,734, filed on Jan. 19, 2022.

(30) Foreign Application Priority Data

Jun. 9, 2022 (TW) .................................. 111121419

(51) Int. Cl.
*H10D 86/60* (2025.01)
*H10D 8/50* (2025.01)
*H10D 86/40* (2025.01)
*H10K 59/126* (2023.01)

(52) U.S. Cl.
CPC ............... *H10D 86/60* (2025.01); *H10D 8/50* (2025.01); *H10D 86/441* (2025.01); *H10K 59/126* (2023.02)

(58) Field of Classification Search
None
See application file for complete search history.

(56) References Cited

U.S. PATENT DOCUMENTS

| | | | |
|---|---|---|---|
| 5,220,210 A * | 6/1993 | Miwada | H10F 77/50 257/443 |
| 8,829,447 B2 | 9/2014 | Ohta et al. | |
| 9,240,485 B2 | 1/2016 | Liu et al. | |
| 9,773,830 B2 | 9/2017 | Goto | |
| 10,068,941 B2 | 9/2018 | Goto | |
| 11,393,859 B2 | 7/2022 | Jo et al. | |
| 2012/0287297 A1 | 11/2012 | Fukuda | |
| 2015/0255740 A1 | 9/2015 | Nakada et al. | |
| 2015/0311409 A1 | 10/2015 | Huang et al. | |
| 2016/0233262 A1 | 8/2016 | Goto | |
| 2017/0309668 A1 | 10/2017 | Goto | |
| 2017/0330848 A1 | 11/2017 | Chen et al. | |
| 2018/0175322 A1 | 6/2018 | Nakada et al. | |

(Continued)

FOREIGN PATENT DOCUMENTS

| | | |
|---|---|---|
| CN | 102956665 | 3/2013 |
| CN | 104216153 | 12/2014 |

(Continued)

*Primary Examiner* — Bilkis Jahan
(74) *Attorney, Agent, or Firm* — JCIPRNET

(57) ABSTRACT

A sensing device has a sensing area, a pad area, and a peripheral area, and the pad area is located between the sensing area and the peripheral area, including: a sensing element, a pad, and a metal strip. The sensing element is located in the sensing area. The pad is located in the pad area and electrically connected to the sensing element. The metal strip is located in the peripheral area, and an extending direction of the metal strip is parallel to an extending direction of the pad.

20 Claims, 7 Drawing Sheets

(56) References Cited

U.S. PATENT DOCUMENTS

| | | | |
|---|---|---|---|
| 2019/0004280 A1* | 1/2019 | Hu | G03B 13/36 |
| 2019/0348459 A1* | 11/2019 | Katkar | H01L 24/32 |
| 2020/0171495 A1 | 6/2020 | Jones et al. | |
| 2021/0028392 A1 | 1/2021 | Nakada et al. | |
| 2021/0099658 A1* | 4/2021 | Tokuhara | H04N 25/709 |

FOREIGN PATENT DOCUMENTS

| | | |
|---|---|---|
| CN | 108963105 | 12/2018 |
| CN | 113497066 | 10/2021 |
| JP | 2001077278 | 3/2001 |
| KR | 20160093083 | 8/2016 |
| KR | 20200133495 | 11/2020 |
| TW | 201630176 | 8/2016 |

\* cited by examiner

SENSING DEVICE

CROSS-REFERENCE TO RELATED APPLICATION

This application claims the priority benefit of U.S. Provisional Application No. 63/300,734, filed on Jan. 19, 2022 and Taiwan Application No. 111121419, filed on Jun. 9, 2022. The entirety of each of the above-mentioned patent applications is hereby incorporated by reference herein and made a part of this specification.

BACKGROUND OF THE INVENTION

Field of the Invention

The invention relates to an optoelectronic device, and more particularly, to a sensing device.

Description of Related Art

Due to their excellent performance, photosensors have been widely used in fields such as security inspection, industrial inspection, and medical diagnosis. For example, in medical diagnosis, X-ray sensors may be used for image capture of human chest cavity, blood vessels, teeth, etc. Such sensors mainly include PIN diodes and thin-film transistors (TFTs), wherein PIN diodes convert light energy into electrical signals, and TFTs are used to read the electrical signals measured by the PIN diodes.

In general, the manufacturing method of a photosensor is that after a multilayer film stack structure of the PIN diode and the TFT is completed on a temporary substrate, a layer of protective film is first provided, and then the temporary substrate is removed, and the multi-layer film stack structure is transferred to a suitable motherboard, and then the multi-layer film stack structure is separated into a plurality of sensing modules by means of laser cutting, and then the protective film is peeled off. However, since the properties of the film layers near the laser cutting line are degraded by the heat of the laser, the film layers with degraded properties are readily peeled off along with the protective film when the protective film is peeled off, and the peeling range of the film layers may further be extended to the inside, resulting in poor production yield and reliability of the sensor.

SUMMARY OF THE INVENTION

The invention provides a sensing device having good production yield and reliability.

An embodiment of the invention provides a sensing device having a sensing area, a pad area, and a peripheral area, and the pad area is located between the sensing area and the peripheral area, including: a sensing element located in the sensing area; a pad located in the pad area and electrically connected to the sensing element; and a metal strip located in the peripheral area, and an extending direction of the metal strip is parallel to an extending direction of the pad.

In an embodiment of the invention, a length of the metal strip is greater than a width thereof.

In an embodiment of the invention, the metal strip is physically separated from the pad.

In an embodiment of the invention, the metal strip is aligned with the pad.

In an embodiment of the invention, the metal strip is staggered from the pad.

In an embodiment of the invention, a pitch of the metal strip is less than or equal to a pitch of the pad.

In an embodiment of the invention, a width of the metal strip is less than a spacing between the pads.

In an embodiment of the invention, an arrangement density of the metal strip is greater than or equal to an arrangement density of the pad.

In an embodiment of the invention, the metal strip has a single-layer or double-layer structure.

In an embodiment of the invention, an extending direction of the metal strip is perpendicular to a side of the sensing device.

In an embodiment of the invention, a width of the metal strip is 1 μm to 50 μm.

In an embodiment of the invention, a minimum distance from the metal strip to the side of the sensing device is 50 μm to 500 μm.

In an embodiment of the invention, the pad area surrounds a portion of the sensing area.

In an embodiment of the invention, the peripheral area surrounds the pad area and the sensing area.

In an embodiment of the invention, the sensing element includes an upper electrode, a lower electrode, and a photoelectric conversion layer located between the upper electrode and the lower electrode, and the metal strip and the lower electrode belong to a same film layer.

In an embodiment of the invention, the sensing device further includes a common electrode electrically connected to the sensing element, and the common electrode and the metal strip belong to a same film layer.

In an embodiment of the invention, the sensing device further includes a switch element electrically connected to the sensing element, and a source of the switch element and the metal strip belong to a same film layer.

In order to make the aforementioned features and advantages of the disclosure more comprehensible, embodiments accompanied with figures are described in detail below.

DESCRIPTION OF THE EMBODIMENTS

Figure 1A:
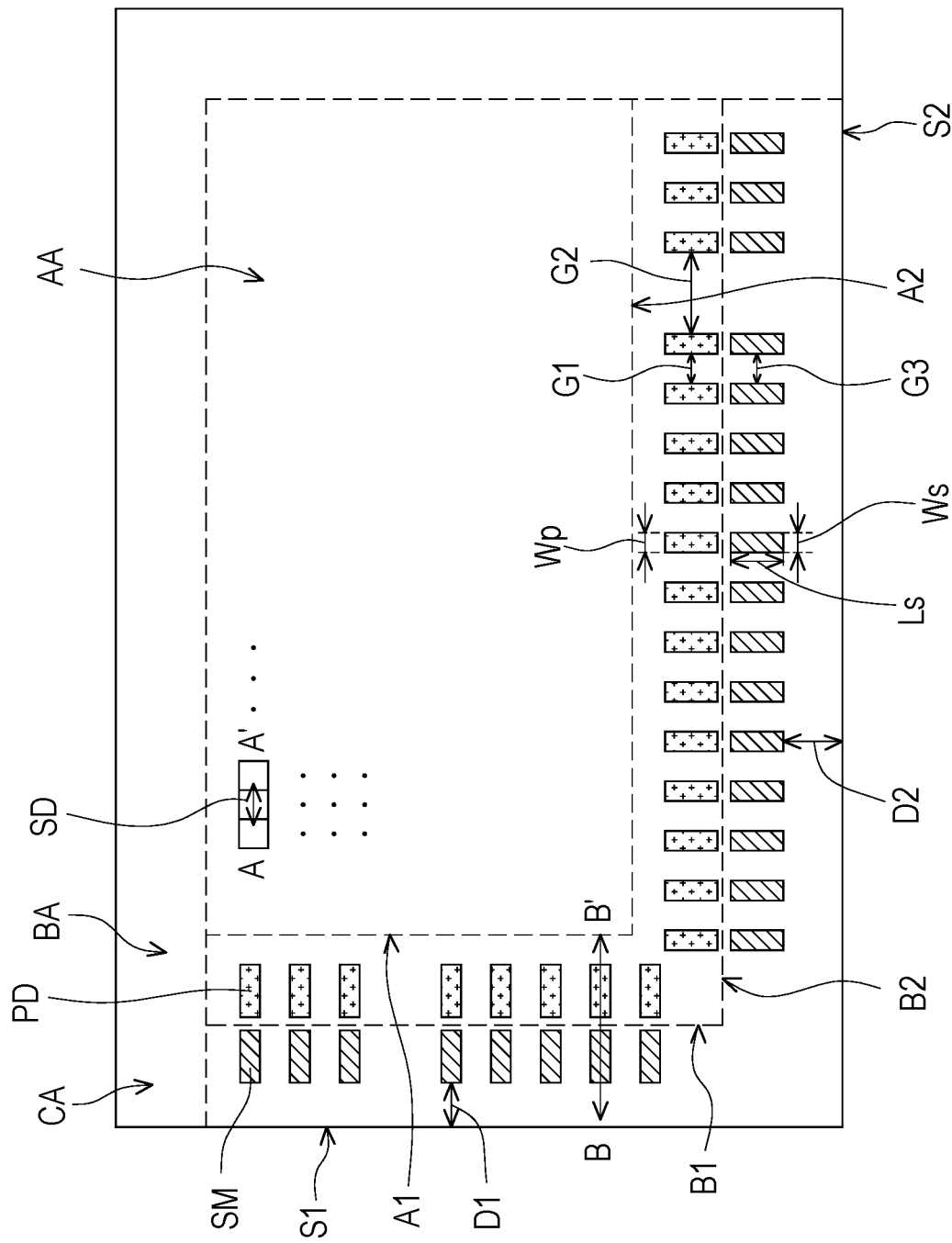
FIG. 1A is a schematic top view of a sensing device 10 according to an embodiment of the invention.

In the figures, for clarity, the thicknesses of, for example, layers, films, panels, and regions are enlarged. In the entire specification, the same reference numerals represent the same elements. It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

The terminology used here is only for the object of describing specific embodiments and is not limiting. As used herein, unless the content clearly indicates otherwise, the singular forms "a", "one", and "the" are intended to include the plural form, including "at least one" or representing "and/or". As used in the specification, the term "and/or" includes any and all combinations of one or a plurality of the associated listed items. It should also be understood that when used in the specification, the term "including" and/or "containing" specifies the presence of stated features, regions, wholes, steps, operations, elements, and/or components, but does not exclude the presence or addition of one or a plurality of other features, regions, wholes, steps, operations, elements, components, and/or a combination thereof.

In addition, relative terms such as "lower" or "bottom" and "upper" or "top" may be used herein to describe the relationship of one element to another element as shown in the figures. It should be understood that relative terms are intended to encompass different orientations of the device in addition to the orientation shown. For example, if the device in one figure is turned over, an element described as being on the "lower" side of the other elements is oriented to being on the "upper" side of the other elements. Thus, the exemplary term "lower" may include the orientations "lower" and "upper", depending on the particular orientation of the figure. Similarly, if the device in one figure is turned over, an element described as "below" other elements or an element "below" is oriented "above" the other elements. Thus, the exemplary term "lower" or "below" may encompass the orientations of above and below.

Taking into account the measurement in question and the specific amount of measurement-related error (i.e., the limitations of the measurement system), "about", "similar", or "substantially" used in the present specification include the value and the average value within an acceptable deviation range of a specific value confirmed by those having ordinary skill in the art. For example, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

In the present specification, exemplary embodiments are described with reference to cross sections of schematics used as ideal embodiments. Therefore, changes in shape of figures used as the results of, for example, manufacturing techniques and/or tolerance may be expected. Therefore, the embodiments of the invention should not be construed to limit the specific shapes of the regions shown in the present specification, but instead include shape deviations caused by, for example, manufacture. For example, regions shown or described as flat generally may have rough and/or non-linear features. Moreover, an acute angle shown may be round. Therefore, the regions shown in the figures are substantially schematic, and the shapes thereof do not refer to the accurate shapes of the regions shown, and also do not limit the scope of the claims.

Figure 1B:
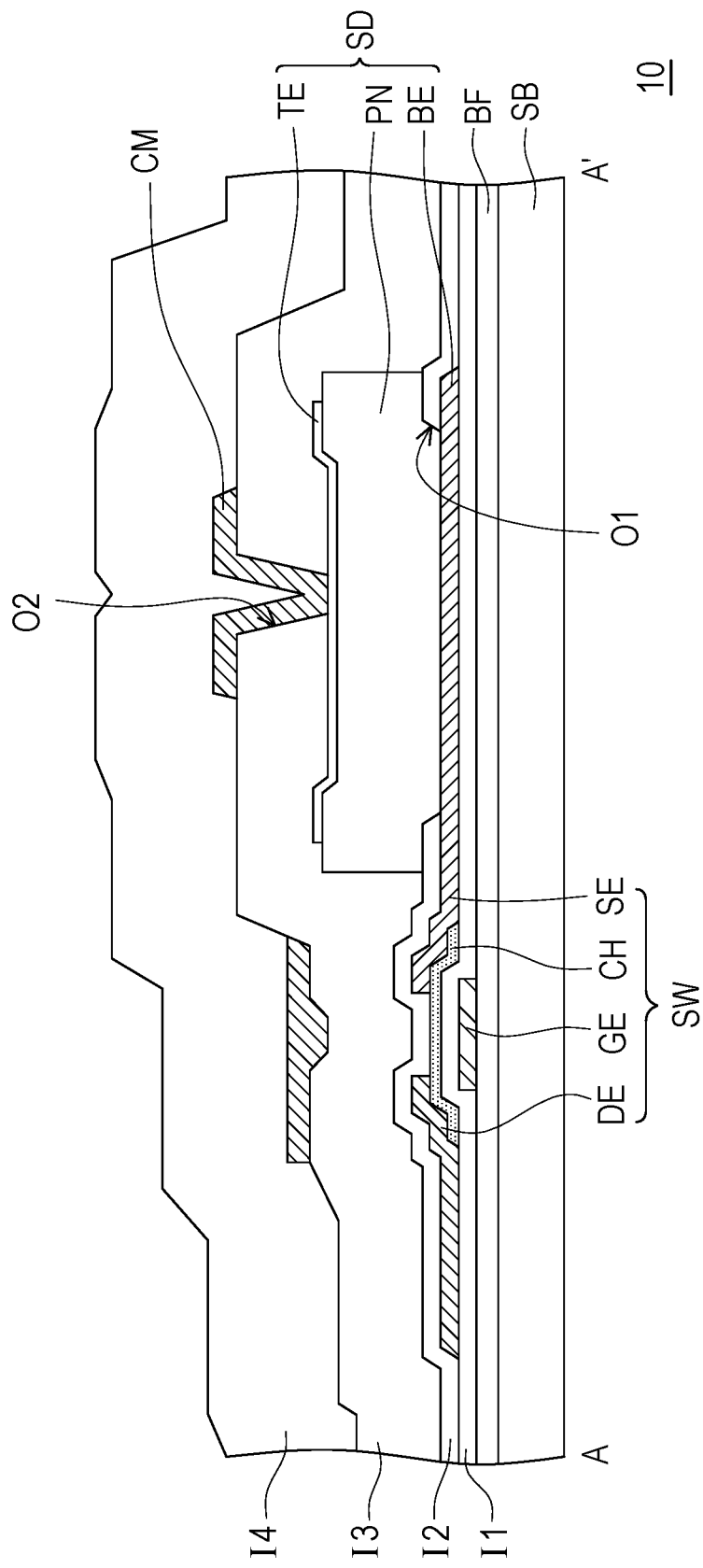
FIG. 1B is a schematic cross-sectional view along section line A-A' of FIG. 1A.
Figure 1C:
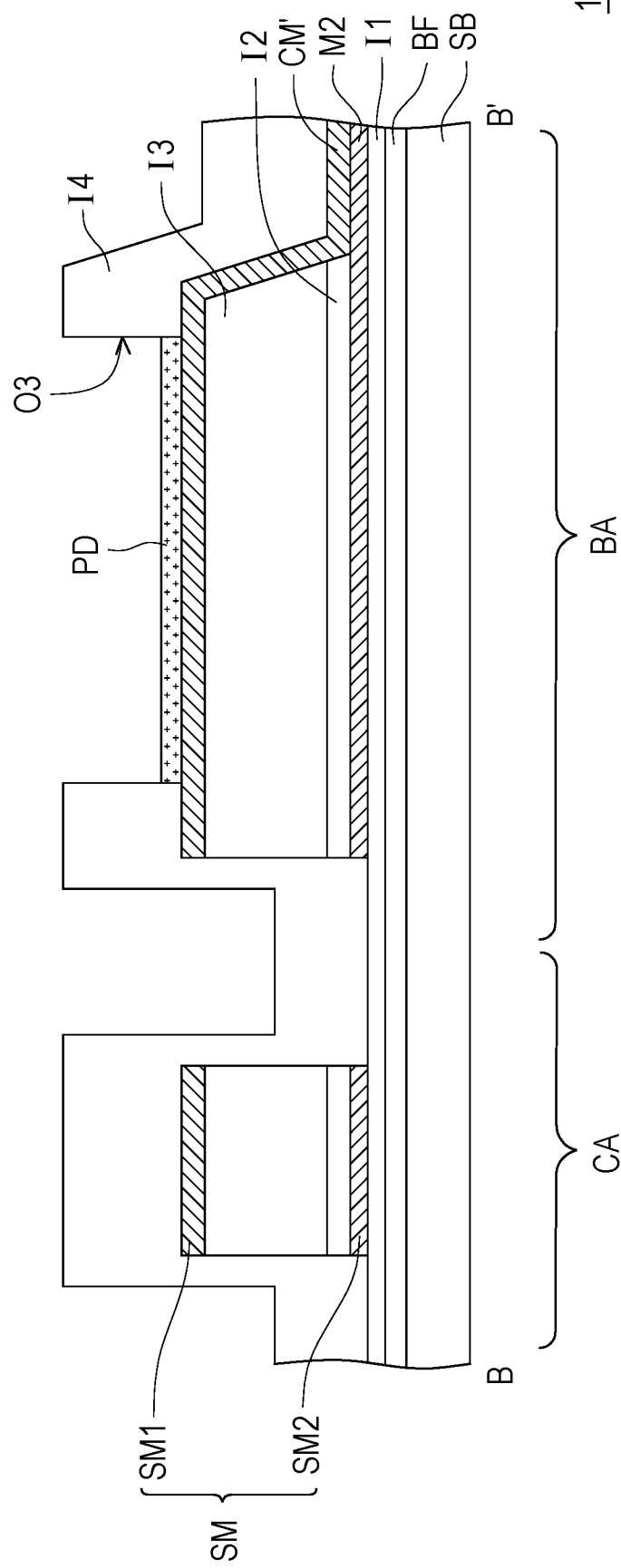
FIG. 1C is a schematic cross-sectional view along section line B-B' of FIG. 1A.

FIG. 1A is a schematic top view of a sensing device 10 according to an embodiment of the invention. FIG. 1B is a schematic cross-sectional view along section line A-A' of FIG. 1A. FIG. 1C is a schematic cross-sectional view along section line B-B' of FIG. 1A. Referring to FIG. 1A to FIG. 1C at the same time, the sensing device 10 has a sensing area AA, a pad area BA, and a peripheral area CA, and the pad area BA is located between the sensing area AA and the peripheral area CA. The sensing device 10 includes: a sensing element SD located in the sensing area AA; a pad PD located in the pad area BA and electrically connected to the sensing element SD; and a metal strip SM located in the peripheral area CA, and the extending direction of the metal strip SM is parallel to the extending direction of the pad PD.

In the present embodiment, the metal strip SM disposed in the peripheral area CA may prevent film layers from peeling off, so that the production yield and reliability of the sensing device 10 may be improved. Hereinafter, the embodiments of each element and film layer of the sensing device 10 are further described with reference to the figures, but the invention is not limited thereto.

Please refer to FIG. 1A and FIG. 1B at the same time, in the present embodiment, a plurality of sensing elements SD arranged in an array may be disposed in the sensing area AA of the sensing device 10. The sensing elements SD are, for example, PIN diodes, for converting light energy into electronic signals. For example, the sensing elements SD may be disposed on the substrate SB, and the sensing elements SD may include an upper electrode TE, a lower electrode BE, and a photoelectric conversion layer PN, wherein the upper electrode TE is located on the photoelectric conversion layer PN, the photoelectric conversion layer PN is located on the lower electrode BE, and the photoelectric conversion layer PN may be connected to the lower electrode BE via an opening O1 in an insulating layer I2. The photoelectric conversion layer PN is located between the upper electrode TE and the lower electrode BE, and the upper electrode TE and the lower electrode BE are electrically independent from each other. The photoelectric conversion layer PN may absorb visible light from above the sensing elements SD and generate a corresponding electrical signal.

The material of the lower electrode BE may include a metal such as chromium (Cr), gold (Au), silver (Ag), copper (Cu), tin (Sn), lead (Pb), hafnium (Hf), tungsten (W), molybdenum (Mo), neodymium (Nd), titanium (Ti), tantalum (Ta), aluminum (Al), zinc (Zn), or an alloy of any combination of the above metals, or a laminate of the above metals and/or alloys, but not limited thereto. The lower electrode BE may also include other conductive materials, such as metal nitrides, metal oxides, metal oxynitrides, stacked layers of metals and other conductive materials, or other materials with conductive properties.

The photoelectric conversion layer PN may include an N-type semiconductor material layer, an intrinsic semiconductor material layer, and a P-type semiconductor material layer sequentially formed on the lower electrode BE. For example, the intrinsic semiconductor material layer is, for example, intrinsic amorphous silicon. The N-type semiconductor material layer is, for example, amorphous silicon doped with phosphorus (P). The P-type semiconductor material layer is, for example, amorphous silicon doped with boron (B), but the invention is not limited thereto.

The upper electrode TE may be a light-transmitting electrode. For example, the material of the upper electrode TE may include indium tin oxide (InSnO), indium zinc oxide (InZnO), aluminum zinc oxide (AlZnO), aluminum indium oxide (AlInO), indium oxide (InO), gallium oxide (GaO), carbon nanotubes, nanosilver particles, metals or alloys with a thickness of less than 60 nanometers (nm), organic transparent conductive materials, or other suitable transparent conductive materials.

In some embodiments, the sensing device 10 may further include a wavelength conversion layer (not shown), and the wavelength conversion layer may be disposed above the plurality of sensing elements SD to convert light (e.g., X-rays) from the upper side of FIG. 1B into visible light, and the wavelength conversion layer may include a material such as cesium iodide (CsI).

In some embodiments, the sensing device 10 may further include a plurality of switch elements SW, the plurality of switch elements SW are disposed in the sensing area AA, and the plurality of switch elements SW may be electrically connected to the plurality of sensing elements SD respectively, so as to read the electrical signals measured by the sensing elements SD. For example, referring to FIG. 1B, the switch elements SW may be disposed on the substrate SB, and the switch elements SW may include a semiconductor layer CH, a source SE, a drain DE, and a gate GE, wherein a barrier layer BF is located between the substrate SB and the gate GE, an insulating layer I1 is located between the gate GE and the semiconductor layer CH, the source SE and the drain DE are respectively connected to two ends of the semiconductor layer CH, the insulating layer I2 is located on the semiconductor layer CH, the source SE, and the drain DE, and the source SE is electrically connected to the lower electrode BE of the sensing elements SD. In addition, the source SE and the lower electrode BE of the sensing elements SD may belong to the same film layer.

The material of the semiconductor layer CH is, for example, a metal oxide material, that is, the switch elements SW may be metal oxide TFTs (metal oxide transistors), but the invention is not limited thereto. In other embodiments, the switch elements SW may also be low-temperature polysilicon (LTPS) TFTs, microcrystalline silicon (micro-Si) TFTs, or amorphous silicon (a-Si) TFTs. Moreover, it should be mentioned that, the gate GE, the source SE, the drain DE, the barrier layer BF, and the insulating layers I1 and I2 may be respectively formed by any materials and methods known to those having ordinary skill in the art, and are therefore not repeated herein.

In some embodiments, the sensing device 10 may further include an insulating layer I3, a common electrode CM, and an insulating layer I4, wherein the insulating layer I3 may be disposed on the switch elements SW and the sensing elements SD; the common electrode CM may be disposed on the insulating layer I3, and the common electrode CM may be electrically connected to the upper electrode TE via an opening O2 in the insulating layer I3; and the insulating layer I4 may be located on the common electrode CM.

The material of the common electrode CM may include metals, alloys, metal nitrides, metal oxides, metal oxynitrides, other conductive materials, or a stacked layer of at least two of the above materials.

Referring to FIG. 1A, the pad area BA of the sensing device 10 may surround a portion of the sensing area AA, and the peripheral area CA may surround the pad area BA, but the invention is not limited thereto, and the configuration of the sensing area AA, the pad area BA, and the peripheral area CA may be changed as needed. Specifically, in the present embodiment, the pad area BA is adjacent to sides A1 and A2 of the sensing area AA, and a plurality of pads PD may be arranged in the pad area BA along the sides A1 and A2. The plurality of pads PD may be substantially extended from the sides A1 and A2 of the sensing area AA toward sides S1 and S2 of the sensing device 10 respectively, and the extending direction of the pads PD may be substantially perpendicular to the adjacent sides A1 and A2 or sides S1 and S2. A spacing G1 between the plurality of pads PD may be the same, but is not limited thereto. For example, the plurality of pads PD may be partitioned according to the electrically connected targets thereof, and a spacing G2 between adjacent areas may be slightly larger than the spacing G1 between pads PD located in the same area. The material of the pads PD may include a transparent conductive material such as indium tin oxide, indium zinc oxide, aluminum zinc oxide, aluminum indium oxide, indium oxide, or gallium oxide.

In the present embodiment, the metal strip SM may be disposed adjacent to sides B1 and B2 of the pad area BA and the sides S1 and S2 of the sensing device 10, and the metal strip SM may be substantially extended from the sides B1 and B2 of the pad area BA toward the sides S1 and S2 of the sensing device 10, respectively. The extending direction of the metal strip SM may be substantially perpendicular to the sides S1 and S2 of the sensing device 10, so that the extending direction of the metal strip SM is substantially parallel to the extending direction of the pads PD. A plurality of metal strips SM may be arranged in the peripheral area CA along the sides B1 and B2. In this way, when the protective film above the insulating layer I3 is peeled off from the side S1 of the sensing device 10, the metal strips SM may prevent film layers (such as the barrier layer BF, the insulating layers I1 and I2, and a flat layer PL) therebelow from being peeled off together. The material of the metal strips SM is, for example, chromium, gold, silver, copper, tin, lead, hafnium, tungsten, molybdenum, neodymium, titanium, tantalum, aluminum, zinc, or an alloy of any combination of the above metals, or a laminate of the above metals and/or alloys, but the invention is not limited thereto.

In the present embodiment, the metal strips SM may be disposed in alignment with the pads PD, and the metal strips SM are physically separated from the pads PD. In other words, each of the metal strips SM may be disposed at the extension of the corresponding pads PD, and the arrangement density of the metal strips SM may be equal to the arrangement density of the pads PD, but the invention is not limited thereto.

In some embodiments, the pitch (a width Ws plus a spacing G3) of the metal strips SM may be similar to or equal to the pitch (a width Wp plus the spacing G1) of the pads PD. In some embodiments, the width Ws of the strip metals SM may be about 1 μm to 50 μm, such as 10 μm, 30 μm, or 40 μm, and a length Ls of the strip metals SM is greater than the width Ws thereof. In some embodiments, minimum distances D1 and D2 from the metal strips SM to the sides S1 and S2 of the sensing device 10 may be about 50 μm to 500 μm, such as 150 μm, 250 μm, or 400 μm, so as not to cause the frame of the sensing device 10 to be too large.

Referring to FIG. 1C, in the present embodiment, the pads PD may be disposed on an electrode CM' which is the same film layer as the common electrode CM, and the pads PD may be electrically connected to the electrode CM' via an opening O3 of the insulating layer I4, so that the pads PD may be electrically connected to the drain DE of the switch elements SW via the electrode CM' and a conductive layer M2.

In some embodiments, the film layer for forming the common electrode CM may be extended to the peripheral area CA and be patterned to become a metal strip SM1. In other words, the metal strip SM1 and the common electrode CM may belong to the same film layer. Moreover, the conductive layer M2 used to form the source SE and the drain DE of the switch elements SW and the lower electrode BE of the sensing elements SD may also be extended to the peripheral area CA, and be patterned to become a metal strip SM2. That is to say, the metal strip SM2 may belong to the same film layer as the source SE and the drain DE of the switch elements SW and the lower electrode BE of the sensing elements SD. In this way, the metal strips SM may include the metal strips SM1 and SM2 and have a double-layer structure, and the insulating layer I2 and the insulating layer I3 may be sandwiched between the metal strips SM1 and SM2. In other embodiments, the metal strips SM may only include the metal strip SM1 or the metal strip SM2 and have a single-layer structure.

Hereinafter, FIG. 2 to FIG. 5 are used to continue to describe other embodiments of the invention and the reference numerals and related contents of the embodiments of FIG. 1A to FIG. 1C are adopted, wherein the same reference numerals are used to denote the same or similar elements, and the description of the same technical contents is omitted. Regarding the description of the omitted parts, reference may be made to the embodiments of FIG. 1A to FIG. 1C, and is not repeated in the following description.

Figure 2:
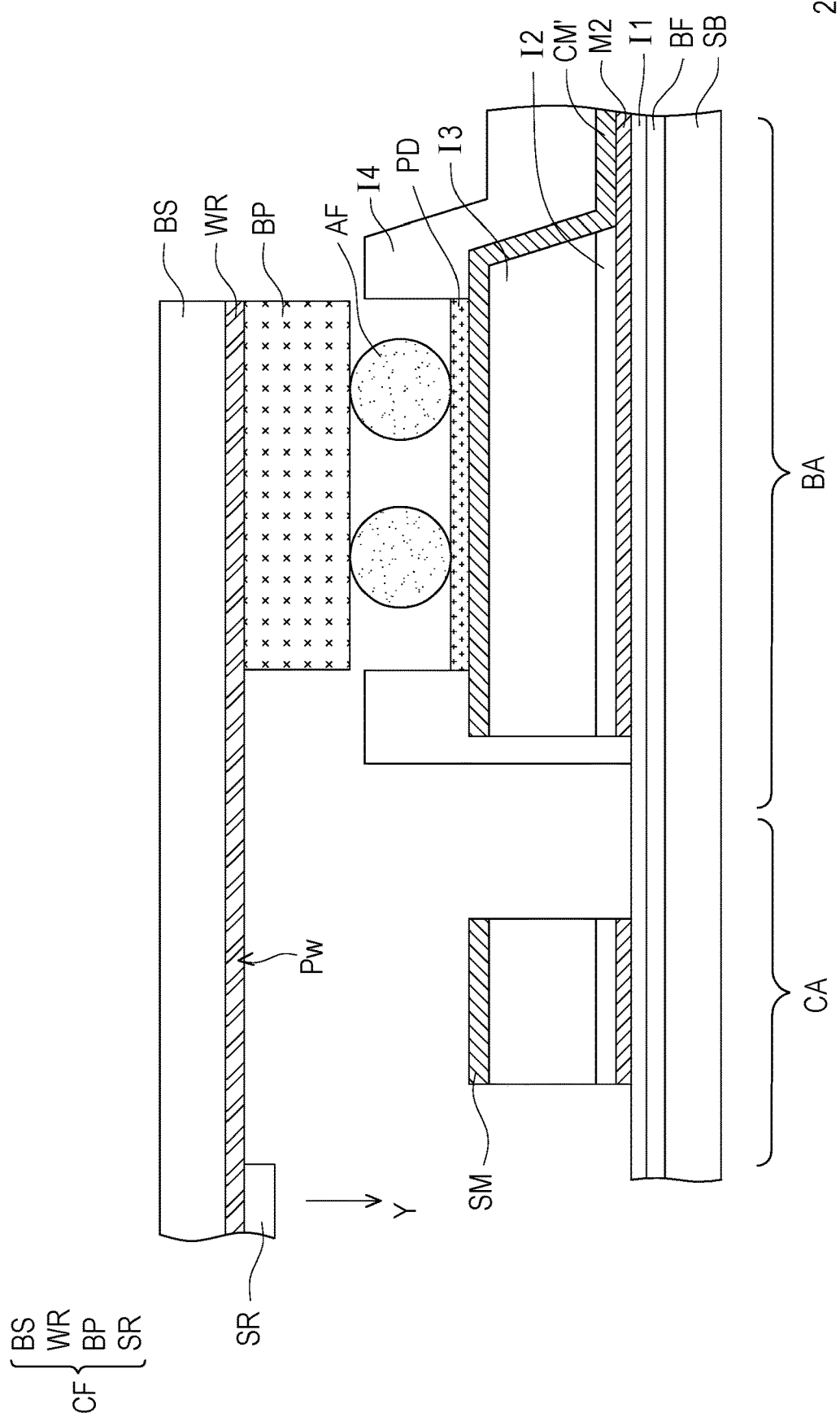
FIG. 2 is a partial schematic cross-sectional view of a sensing device 20 according to an embodiment of the invention.

FIG. 2 is a partial cross-sectional schematic diagram of a sensing device 20 according to an embodiment of the invention. The sensing device 20 may include: the substrate SB, the barrier layer BF, the insulating layer I1, the conductive layer M2, the insulating layer I2, the insulating layer I3, the electrode CM', the insulating layer I4, the pads PD, and the metal strips SM, the pads PD are located in the pad area BA, and the metal strips SM are located in the peripheral area CA. The main difference between the sensing device 20 shown in FIG. 2 and the sensing device 10 shown in FIG. 1A to FIG. 1C is that the sensing device 20 further includes a chip-bonding component CF.

For example, in the present embodiment, the chip-bonding component CF may include a base plate BS, a metal wire WR, and a conductive bump BP. The metal wire WR may be disposed on the base plate BS, one end of the metal wire WR may be connected to the conductive bump BP, and another end of the metal wire WR may be electrically connected to, for example, a chip (not shown) disposed on the chip-bonding component CF. In addition, the conductive bump BP may also be electrically connected to the pads PD by, for example, a conductive adhesive AF. In this way, the chip on the chip-bonding component CF may transmit a signal to the switch elements SW via the metal wire WR, the conductive bump BP, the conductive adhesive AF, the pads PD, and the electrode CM'.

In some embodiments, the chip-bonding component CF may further include an insulating layer SR, and the insulating layer SR may cover a portion of the metal wire WR, so as to avoid unnecessary electrical connection between the metal wire WR and other elements or film layers. However, since the insulating layer SR may not completely cover the exposed metal wire WR, for example, a portion Pw of the metal wire WR may be exposed between the conductive bump BP and the insulating layer SR. The insulating layer covering the metal strips SM may be peeled off during the manufacturing process, resulting in the metal strips SM being exposed. In this case, after the chip-bonding component CF is folded in a direction Y, the portion Pw of the metal wire WR may be pressed down to be in contact with the metal strips SM. Therefore, if the width of the metal wire WR is similar to or equal to the width of the pads PD, the width of the metal strips SM is preferably less than the spacing between the metal wire WR or the pads PD, in order to electrically separate the chip-bonding component CF from the metal strips SM, and thus a short circuit between the two adjacent pads PD via the metal wire WR of the chip-bonding component CF and the metal strips SM is avoided.

Figure 3:
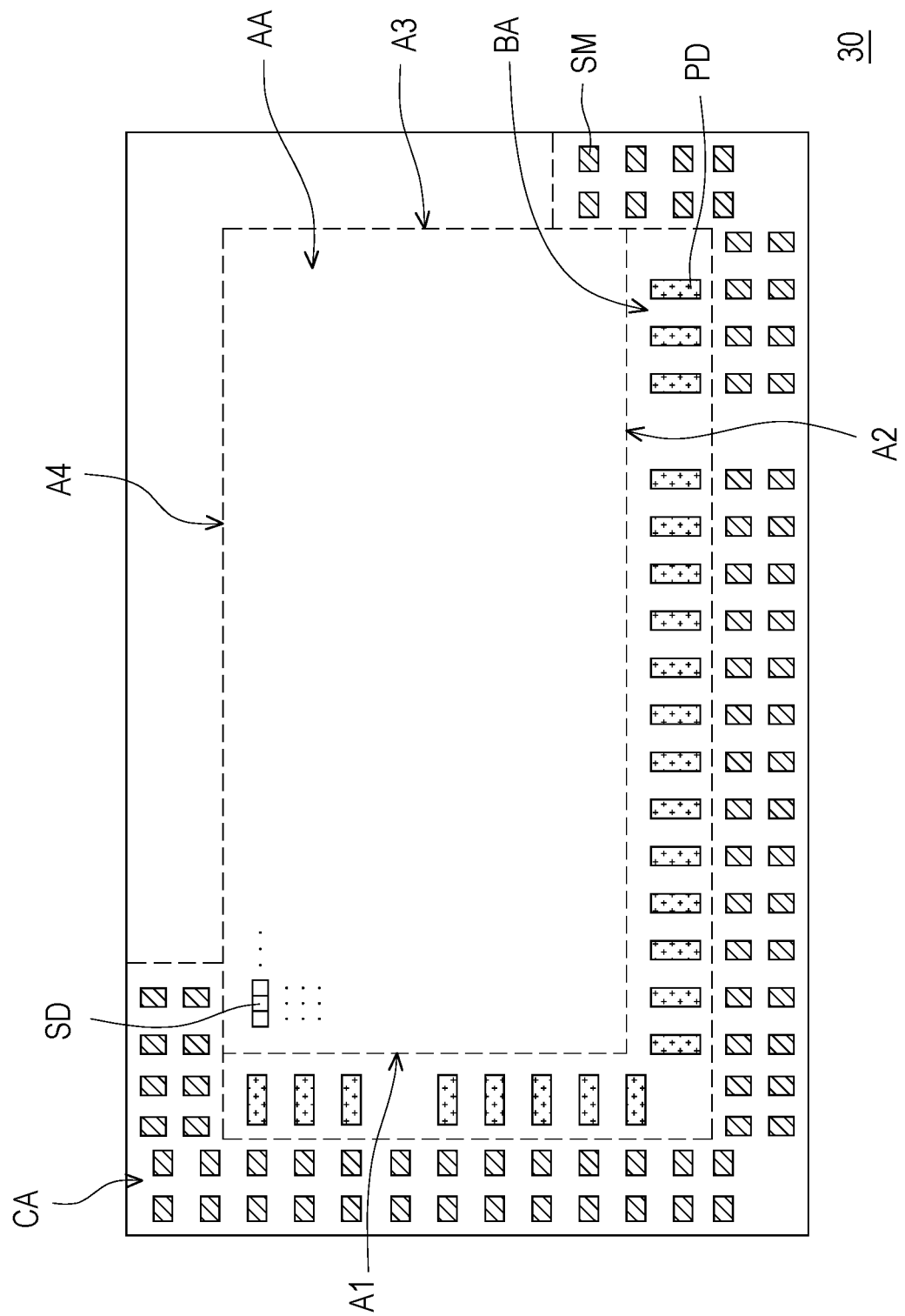
FIG. 3 is a schematic top view of a sensing device 30 according to an embodiment of the invention.

FIG. 3 is a schematic top view of a sensing device 30 according to an embodiment of the invention. The sensing device 30 has the sensing area AA, the pad area BA, and the peripheral area CA, and the sensing device 30 includes: the sensing elements SD located in the sensing area AA; the pads PD located in the pad area BA; and the strip metals SM located in the peripheral area CA, and the extending direction of the metal strips SM is parallel to the extending direction of the adjacent pads PD.

The main differences between the sensing device 30 shown in FIG. 3 and the sensing device 10 shown in FIG. 1A to FIG. 1C are: the pad area BA of the sensing device 30 may surround a portion of the sensing area AA, and the peripheral area CA may surround the pad area BA and a portion of the sensing area AA. Specifically, in the present embodiment, the pad area BA may be adjacent to the sides A1 and A2 of the sensing area AA, and the peripheral area CA may be adjacent to the pad area BA and a portion of sides A3 and A4 of the sensing area AA. In other words, although the pads PD are not disposed on the outer sides of the sides A3 and A4 of the sensing area AA, some metal strip SMs may still be disposed on the outer sides of the sides A3 and A4 of the sensing area AA near the pads PD. In this way, the film layers at the outer sides of the sides A3 and A4 of the sensing area AA near the pads PD are prevented from peeling off.

In some embodiments, the peripheral area CA of the sensing device 30 may also be provided with double rows of the metal strips SM. Alternatively, in other embodiments, the peripheral area CA of the sensing device 30 may be provided with three or more rows of the metal strips SM, which may also have the effect of preventing the peeling of the peripheral film layer.

Figure 4:
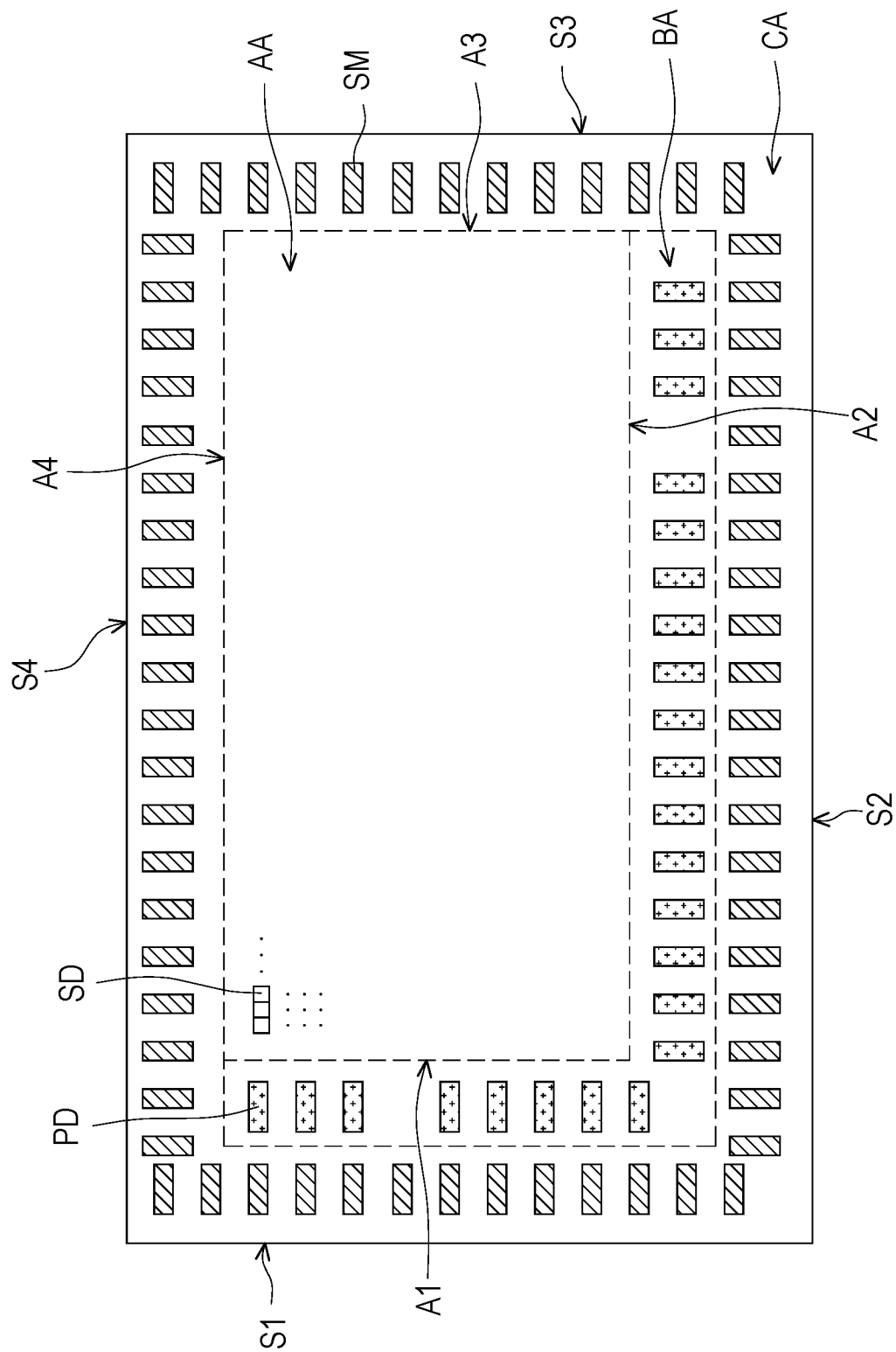
FIG. 4 is a schematic top view of a sensing device 40 according to an embodiment of the invention.

FIG. 4 is a schematic top view of a sensing device 40 according to an embodiment of the invention. The sensing device 40 has the sensing area AA, the pad area BA, and the peripheral area CA, and the sensing device 40 includes: the sensing elements SD located in the sensing area AA; the pads PD located in the pad area BA; and the strip metals SM located in the peripheral area CA, and the extending directions of the metal strips SM and the pads PD are both perpendicular to the extending directions of the adjacent sides S1, S2, S3, and S4.

The main differences between the sensing device 40 shown in FIG. 4 and the sensing device 10 shown in FIG. 1A to FIG. 1C are: the pad area BA of the sensing device 40 surrounds a portion of the sensing area AA, and the peripheral area CA may surround the pad area BA and the sensing area AA. Specifically, in the present embodiment, the pad area BA may be adjacent to the sides A1 and A2 of the sensing area AA, and the peripheral area CA may be adjacent to the pad area BA and the sides A3 and A4 of the sensing area AA. In other words, the metal strips SM may be disposed on the four sides S1, S2, S3, S4 of the sensing device 40, and the metal strips SM may be arranged along the four sides S1, S2, S3, and S4 of the sensing device 40 at substantially equal intervals. In this way, regardless of which side the covering protective film is torn off from the sensing device 40, the metal strips SM may prevent the film layer therebelow from being peeled off together.

Figure 5:
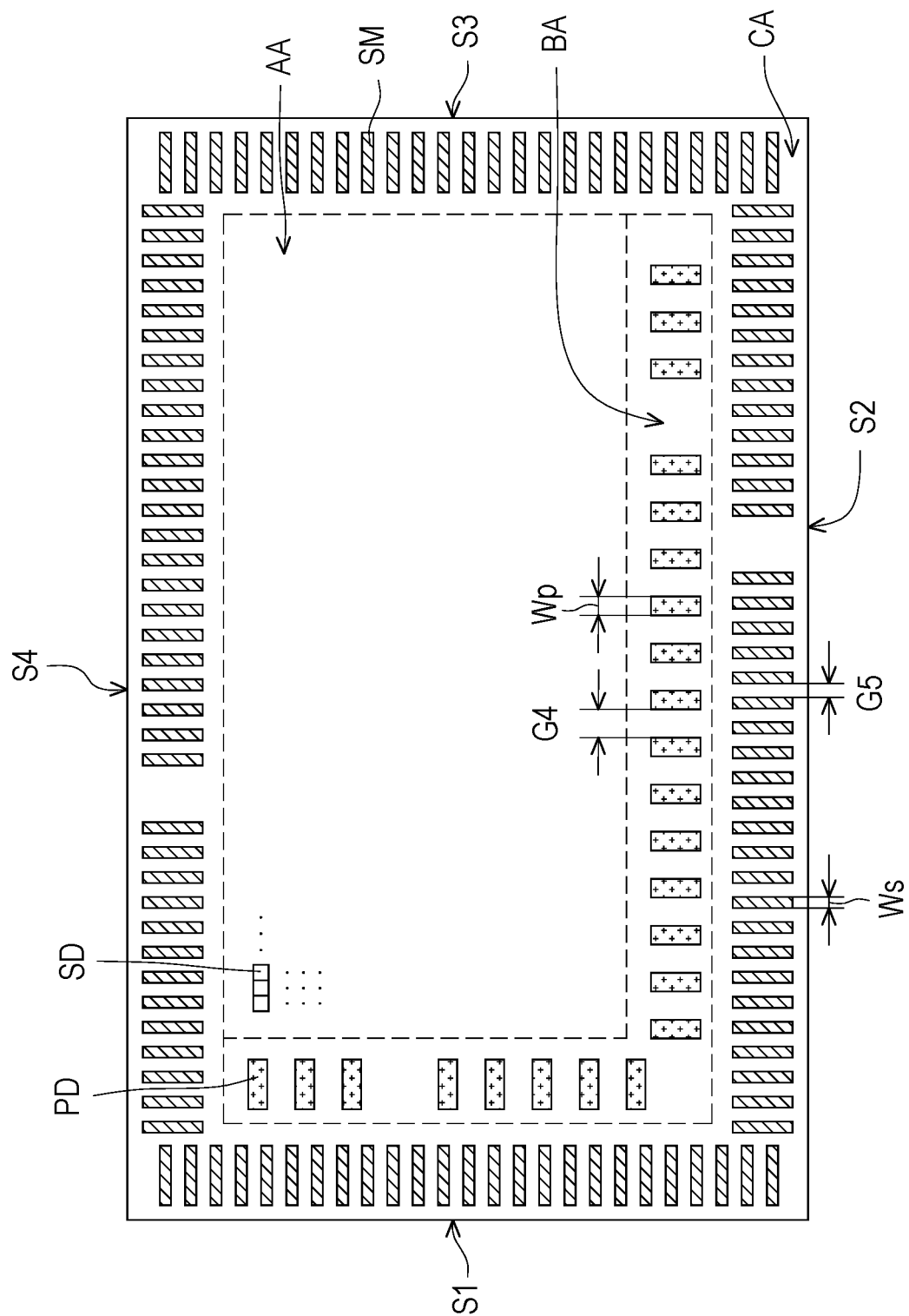
FIG. 5 is a schematic top view of a sensing device 50 according to an embodiment of the invention.

FIG. 5 is a schematic top view of a sensing device 50 according to an embodiment of the invention. The sensing device 50 has the sensing area AA, the pad area BA, and the peripheral area CA, and the sensing device 50 includes: the sensing elements SD located in the sensing area AA; the pads PD located in the pad area BA; and the strip metals SM located in the peripheral area CA, and the extending directions of the metal strip SM and the pads PD are both perpendicular to the extending directions of the adjacent sides S1, S2, S3, and S4.

The main difference between the sensing device 50 shown in FIG. 5 and the sensing device 40 shown in FIG. 4 is that the arrangement density of the metal strips SM of the sensing device 50 may be greater than the arrangement density of the pads PD. That is, the arrangement density of the metal strips SM may be higher than the arrangement density of the pads PD, so as to more specifically prevent the film layer from peeling off. In this way, in the extending direction of the metal strips SM and the pads PD, the metal strips SM may not be aligned with the pads PD. In other words, the arrangement of the metal strips SM may be staggered from the arrangement of the pads PD, and the pitch of the pads PD (a spacing G4 plus the width Wp) may be greater than the pitch of the metal strips SM (a spacing G5 plus the width Ws).

Based on the above, in the sensing device of the invention, film layers may be prevented from peeling off by disposing the metal strips in the peripheral area, thereby improving the production yield and reliability of the sensing device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A sensing device, having a sensing area, a peripheral area and a pad area located between the sensing area and the peripheral area, comprising:
   a sensing element located in the sensing area;
   a pad located in the pad area and electrically connected to the sensing element;
   a metal strip located in the peripheral area, wherein an extending direction of the metal strip is parallel to an extending direction of the pad; and
   a switch element electrically connected to the sensing element, wherein a source of the switch element and the metal strip belong to a same film layer.

2. The sensing device of claim 1, wherein a length of the metal strip is greater than a width thereof.

3. The sensing device of claim 1, wherein the metal strip is physically separated from the pad.

4. The sensing device of claim 3, wherein the metal strip is aligned with the pad.

5. The sensing device of claim 3, wherein the metal strip is staggered from the pad.

6. The sensing device of claim 1, wherein a pitch of the metal strip is less than or equal to a pitch of the pad.

7. The sensing device of claim 1, wherein a width of the metal strip is less than a spacing between the pads.

8. The sensing device of claim 1, wherein an arrangement density of the metal strip is greater than or equal to an arrangement density of the pad.

9. The sensing device of claim 1, wherein the metal strip has a single-layer or double-layer structure.

10. The sensing device of claim 1, wherein an extending direction of the metal strip is perpendicular to a side of the sensing device.

11. The sensing device of claim 1, wherein a width of the metal strip is 1 μm to 50 μm.

12. The sensing device of claim 1, wherein a minimum distance of the metal strip to a side of the sensing device is 50 μm to 500 μm.

13. The sensing device of claim 1, wherein the pad area surrounds a portion of the sensing area.

14. The sensing device of claim 13, wherein the peripheral area surrounds the pad area and the sensing area.

15. A sensing device, having a sensing area, a peripheral area and a pad area located between the sensing area and the peripheral area, comprising:
   a sensing element located in the sensing area;
   a pad located in the pad area and electrically connected to the sensing element; and
   a metal strip located in the peripheral area, wherein an extending direction of the metal strip is parallel to an extending direction of the pad,
   wherein the sensing element comprises an upper electrode, a lower electrode, and a photoelectric conversion layer located between the upper electrode and the lower electrode, and the metal strip and the lower electrode belong to a same film layer.

16. A sensing device, having a sensing area, a peripheral area and a pad area located between the sensing area and the peripheral area, comprising:
   a sensing element located in the sensing area;
   a pad located in the pad area and electrically connected to the sensing element;
   a metal strip located in the peripheral area, wherein an extending direction of the metal strip is parallel to an extending direction of the pad; and
   a common electrode electrically connected to the sensing element, wherein the common electrode and the metal strip belong to a same film layer.

17. The sensing device of claim 15, wherein a width of the metal strip is 1 μm to 50 μm.

18. The sensing device of claim 15, wherein a minimum distance of the metal strip to a side of the sensing device is 50 μm to 500 μm.

19. The sensing device of claim 16, wherein a width of the metal strip is 1 μm to 50 μm.

20. The sensing device of claim 16, wherein a minimum distance of the metal strip to a side of the sensing device is 50 μm to 500 μm.

* * * * *